United States Patent [19]

Papson

[11] 4,167,709

[45] Sep. 11, 1979

[54] PUSH-PULL AMPLIFIER OUTPUT CIRCUIT

[75] Inventor: John C. Papson, Melville, N.Y.

[73] Assignee: Communication Associates, Inc., Huntington Station, N.Y.

[21] Appl. No.: 887,509

[22] Filed: Mar. 17, 1978

[51] Int. Cl.$^2$ .............................................. H03F 3/26
[52] U.S. Cl. .................................. 330/276; 330/302; 330/306
[58] Field of Search ........................ 330/276, 302, 306

[56] References Cited

U.S. PATENT DOCUMENTS

| 3,652,948 | 3/1972 | Fierstien et al. ................. 330/276 |
| 3,821,655 | 6/1974 | Fisher .............................. 330/276 |

*Primary Examiner*—Lawrence J. Dahl
*Attorney, Agent, or Firm*—Posnack, Roberts, Cohen & Spiecens

[57] ABSTRACT

A high frequency push-pull amplifier which includes an improved output circuit to eliminate spurious emissions, typically low frequency parametric oscillations. The output circuit includes a low pass filter with an inductive input so as to avoid a series resonance to any harmonic of the desired output signal of the amplifier. A resistive termination is provided to any of the in phase signal components between the push-pull amplifier and the low pass filter. Also, to inhibit any tendency towards parametric oscillations, the variation in output capacitance with respect to collector voltage of the transistors is minimized by placing a capacitor in parallel with the collector capacitance, which is several times the collector to emitter capacitance of the transistors at their normal collector voltage.

9 Claims, 2 Drawing Figures

PUSH-PULL AMPLIFIER OUTPUT CIRCUIT

BACKGROUND OF THE INVENTION

This invention relates to high frequency amplifiers, and more particularly to high frequency, bi-polar, push-pull broad band amplifier output circuit arrangement.

High frequency push-pull amplifiers are well known and are frequently utilized as power amplifiers. However, such push-pull amplifiers have problems concerning their output frequencies. In many push-pull circuits there is a tendency to develop destructive parametric oscillations. Also, excessive harmonics are also developed which limit the efficiency of the amplifier. The spurious emission problems are especially of concern when the push-pull amplifier is operated in conjunction with a low pass filter. Such low pass filters are often provided on the output port of the amplifier to suppress the harmonic frequency output. These spurious emissions are generally of the low frequency parametric type and appear as side bands about the desired signal frequency. They generally occur when a harmonic of the desired signal is terminated by a series resistance in the low pass filter.

Various circuits have attempted to improve the efficiency of high frequncy push-pull amplifiers by modifying the circuit and adding additional components. One such arrangement is described in U.S. Pat. No. 3,821,655. This patent recognizes that the push-pull amplifier has excessive second harmonic voltages and also that it tends to develop destructive parametric oscillations. The second harmonic voltages are reduced by placing a capacitor across each transistor. The value of the capacitor is set so that in combination with the output inductance of the semiconductor transistor, it forms a resonant circuit which resonates at approximately the frequency of the second harmonic of the output signal. The parametric osciallations are minimized by providing an input circuit which has an impedance which matches the input impedance of the amplifier.

Another approach to reducing the spurious higher harmonics of signal oscillations is provided in U.S. Pat. No. 2,931,986. In that arrangement, an impedance which is low with respect to the signal frequencies but high with respect to the higher harmonics to be repressed, is connected in a common circuit between the input transformer and the corresponding electrodes of the two transistors.

While each of these, as well as other arrangements, have tried to address the problem of harmonic and parametric oscillations, thus far, no complete solution to this problem has yet been suggested.

SUMMARY OF THE INVENTION it is, accordingly, an object of the present invention to provide a high frequency push-pull amplifier which avoids the aforementioned problems of prior art devices.

Yet another object of the present invention is to provide a high frequency push-pull amplifier which includes an improved amplifier output circuit which suppresses spurious emissions in the output signal.

A further object of the present invention is to provide a high frequency push-pull amplifier coupled to a low pass filter which suppresses spurious emissions.

Yet a further object of the present invention is to provide a high frequency, bi-polar, push-pull, broad band, amplifier whose output is coupled to a low pass filter and which removes spurious emission problems.

Yet a further object of the present invention is to provide an amplifier output circuit for a high frequency push-pull amplifier which can interconnect to a low pass filter and which tends to suppress spurious emissions, including parametric oscillations.

Briefly, the present invention is based upon the findings that spurious emissions from a high frequency push-pull amplifier generally occurs when a harmonic of the desired signal is terminated by a series resonance in a low pass filter connected at the output port of the amplifier. Such low pass filter is generally connected for harmonic suppression. However, in order to suppress the spurious emissions, it has been found that the low pass filter which follows the amplifier should not present a series resonance to any harmonic of the desired signal. Additionally, the variation in output capacitance with respect to the collector voltage of the transistors, should be minimized in order to inhibit any tendency towards parametric oscillations. Finally, a resistance termination should be provided to any in-phase signal components which exist between the push-pull amplifier and the low pass filter.

In achieving this situation, there is provided a high frequency amplifier which includes, in combination, a pair of transistors, each of which has a base, emitter and collector electrode. The transistors are connected together in a push-pull circuit arrangement. The collector electrode of each transistor exhibits a collector to emitter capacitance. An input circuit is provided for applying an input signal to the base electrodes of the transistors. An output transformer is also provided for deriving an output signal in common from the collectors to the transistors. Capacitance means are connected between the collector and emitter electrodes of each of the transistors. Each of the capacitance means has a capacitance value which is several times the collector to emitter capacitance of the transistor at its normal collector voltage. In this manner, variation in the output capacitance of the transistors with respect to the collector voltage is minimized to reduce parametric oscillations.

Additionally, a low pass filter is coupled to the output transformer and includes an inductive input so that the low pass filter passes through a series resonance between the highest frequency in the half octave band and twice the lowest frequency in the same band, where the low pass filter is arranged in approximately ½ octave bands of the frequency of the output signal.

Finally, a 180° hybrid network is interconnected between the push-pull arrangement and the low pass filter, and includes a resistor on one of its ports. An inductor is connected in parallel with the resistor to provide a direct current path to supply power to the transistors. A capacitor is connected across the supply path.

The aforementioned objects, features and advantages of the invention will, in part, be pointed out with particularity and will, in part, become obvious from the following more detailed description of the invention, taken in conjunction with the accompanying drawing, which forms an integral part thereof.

BRIEF DESCRIPTION OF THE DRAWINGS

In the Figures.

In the various figures of the drawing, like reference numerals designate like parts.

DESCRIPTION OF THE PREFERRED EMBODIMENT

Figure 1:
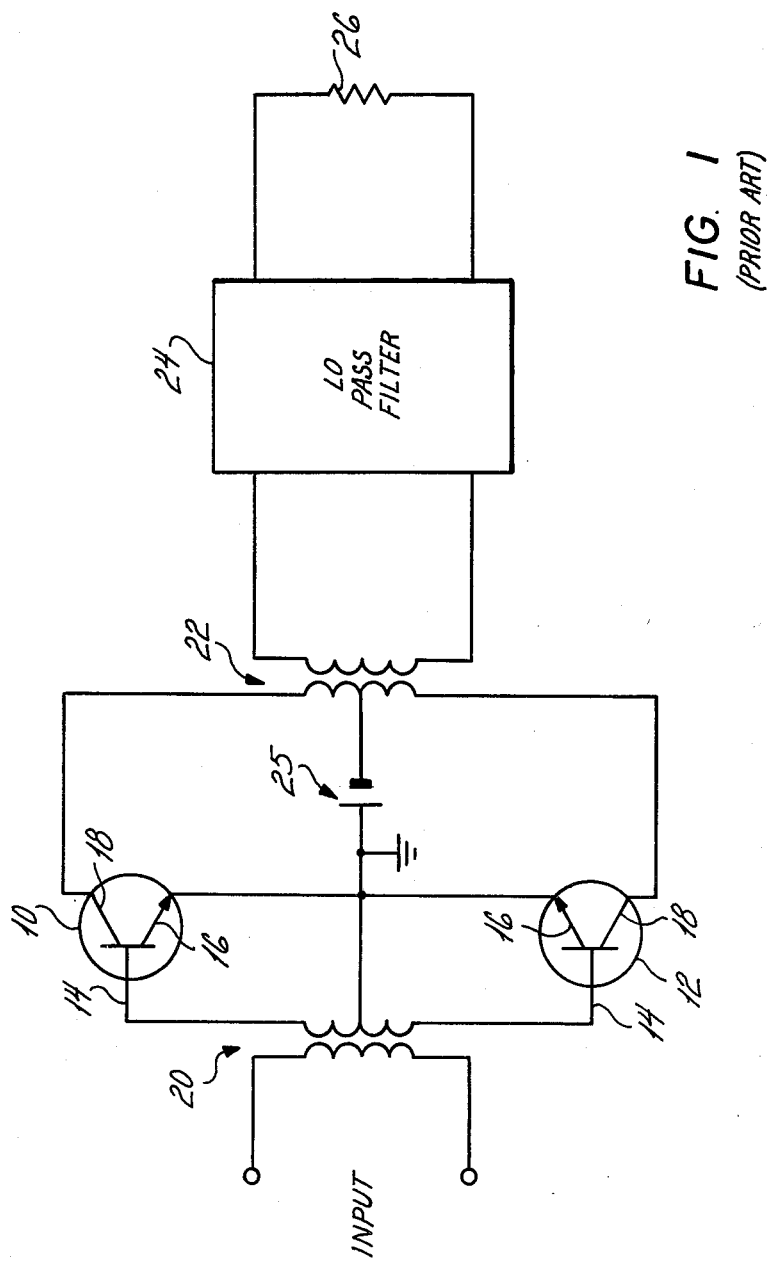
FIG. 1 is a schematic diagram of a typical prior art push-pull transistor amplifier.

Referring now to FIG. 1, there is shown a conventional prior art transistor push-pull high frequency high power amplifier. The amplifier typically includes a pair of power transistors 10, 12, each of which includes a base electrode 14, an emitter electrode 16, and a collector electrode 18. An input transformer 20 provides the input signal between the base and emitter electrodes of the two transistors. A center-tapped output transformer 22 is connected across the collector electrodes 18 to provide the output signal in common from the two transistors. A DC voltage supply 25 provides the appropriate biasing to the collector electrodes. The amplifier output across the secondary of the output transformer 22 is typically passed through a low pass filter 24 for harmonic suppression. This is achieved by providing a series resonance termination in the filter to the harmonic of the desired signal. The output from the low pass filter goes to a load 26.

Theoretically, when the amplifier shown in FIG. 1 is operated as a class B or class C push-pull amplifier, it should provide good performance. However, it has been found that numerous harmonic voltages are produced as well as parametric oscillations. The parametric oscillations are especially noted because of the use of the low pass filter. These parametric oscillations appear as sidebands about the desired signal frequency.

Figure 2:
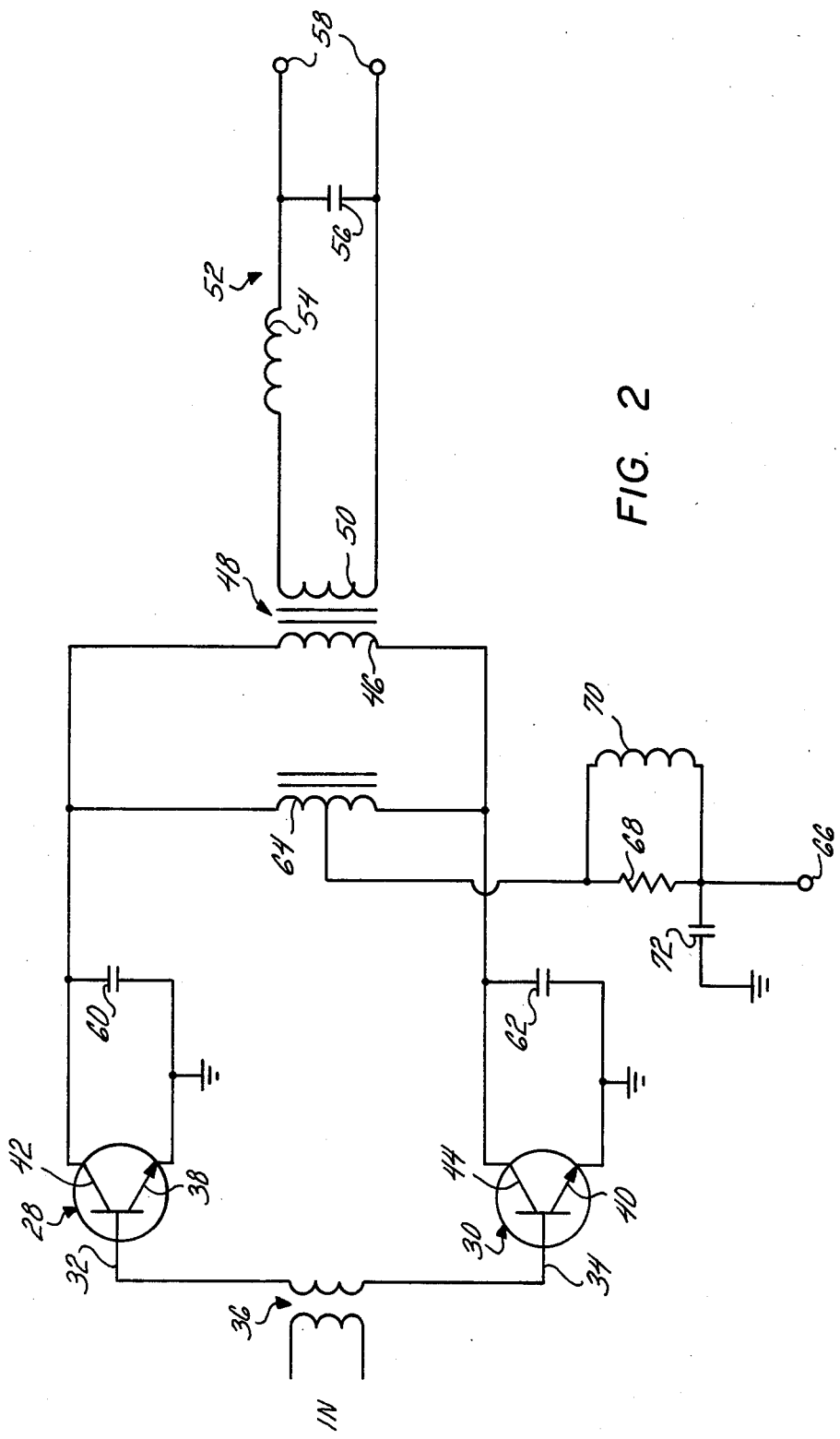
FIG. 2 is a circuit diagram of a push-pull amplifier in accordance with the present invention.

Referring now to FIG. 2 the improved high frequency, bi-polar, push-pull broad band amplifier in accordance with the present invention will now be described.

The amplifier comprises first and second transistors 28 and 30 having their respective bases 32, 34 interconnected together and coupled to a transformer 36 providing the input signals to the transistors. The respective emitters 38, 40, are both connected to ground. Interconnecting the collectors 42, 44 is the primary 46 of the transformer 48 whose secondary 50 is connected to a low pass filter shown generally at 52. One stage of the low pass filter is shown including a series inductor 54 and a parallel capacitor 56. The output at 58 is taken across the low pass filter.

A capacitor 60 is placed between the collector 42 and the emitter 38 of the transistor 28. A similar capacitor 62 is also placed across the collector 44 and emitter 40 of the transistor 30. A second transformer 64 is placed in parallel with the transformer 48 so as to form a hybrid transformer in combination therewith. The transformer 64 is center-tapped with its center point connected to a voltage supply at the terminal 66. A resistor 68 is connected in series across this line and an inductor 70 is connected in parallel across the resistor 68. Capacitor 72 is connected from the supply 66 to ground.

In order to suppress the spurious emissions from the push-pull amplifier, the low pass filter which follows the amplifier should not present a series resonance to any harmonic of the desired signal. This is achieved by means of the low pass filter 52 as shown. Generally, such low pass filters are arranged in approximately one half octave bands. By designing the filter to have an inductive input, the suppression can be achieved. The inductors are so arranged so that it passes through a series resonance between the highest frequency in the octave bands and twice the lowest frequency in the same bands. At all frequencies above this resonance, the filter will appear inductive.

In order to inhibit any tendency towards parametric oscillations, the variation in output capacitance with respect to the collector voltage of the transistors should be minimized. This is achieved by means of the capacitors 60 and 62 which are placed in parallel across the collector capacitance. The capacitors 60,62 each have several times the collector to emitter capacitance of each of the transistors at their normal collector voltage.

At the same time, the capacitors 60, 62 are selected to act as the high frequency compensating capacitor for the secondary of the transformer 48. The high frequency compensating capacitor for the secondary must be eliminated and the leakage inductance of the transformer subtracted from the required input inductance 54 of the low pass filter 52. By utilizing the capacitors 60, 62 the maximum frequency is increased at which the compensated transformers normal cut off frequency which would usually limit stable operation.

Additionally, in order to further suppress spurious emissions, a resistance termination should be provided to any in-phase signal components between the push-pull amplifier and the low pass filter. This is achieved by utilizing a 180° hybrid network placed between the push-pull output of the amplifier and the low pass filter. This network serves to terminate the parallel mode output.

The two transformers 48 and 64 form the hybrid network and also serve as the direct current feed to the collectors of the transistors 28 and 30. Also, they transform the low collector impedance up to a more usable value. The transformer 64 is center-tapped and the centertap serves as the port of the hybrid which is terminated in the resistance 68. The value of the resistor is approximately equal to ¼ of the normal collector to collector load impedance. The resistor 68 is placed in parallel with an inductor 70 to form the direct current path by which power is supplied to the transistors. The inductor 70 is of a value such as to present an impedance greater than the resistance from resistor 68 to frequencies of an order of magnitude less than the normal frequency range of operation for the amplifier. A capacitor 72 is placed on the direct current collector supply line. This capacitor is of such a value so as to ensure that the resistor 68 appears as a low reactance termination over the frequency range of one order of magnitude less than the lowest frequency of operation to the maximum frequency of operation.

While there have been shown and described and pointed out the fundamental novel features of the invention as applied to a preferred embodiment thereof, it will be understood that various omissions, substitutions and changes in the form and details of the device illustrated and in its operation may be made by those skilled in the art without departing from the spirit of the invention. It is the intention, therefore, to be limited only as indicated by the scope of the claims appended hereto.

What is claimed is:

1. A high frequency amplifier, comprising in combination, a pair of transistors, each having base, emitter and collector electrodes, and being connected together in a push-pull circuit arrangement, the collector electrodes each exhibiting a collector to emitter capacitance, input means for applying an input signal to the base electrodes of the transistors, output transformer means for deriving an output signal in common from the collectors of the transistors, and capacitance means connected between the collector and emitter electrodes of each transistor, each of said capacitance means having a capacitance value which is in the order of magnitude of several times the collector to emitter capacitance of the transistor at the normal collector voltage, whereby the variation in the output capacitance of said transistors with respect to the collector voltage is minimized to reduce parametric oscillations, said amplifier further comprising a low pass filter coupled to said output transformer for providing harmonic suppression, said filter being so constructed and arranged to avoid presenting a series resonance to any harmonic of the output signal, and resistance termination means for in-phase signal components between said push-pull circuit arrangement and said low pass filter, said resistance termination means comprising a 180° hybrid network interconnected between said push-pull arrangement and said low pass filter, said hybrid network including a port terminated in a resistor.

2. A high frequency amplifier as in claim 1 and wherein each of said capacitance means acts as a high frequency compensating capacitor for the secondary of said output transformer, whereby the cutoff frequency of said output transformer is increased.

3. A high frequency amplifier as in claim 1 and wherein said low pass filter is arranged in approximately one half octave bands of the frequency of the output signal, and wherein said low pass filter comprises an inductive input low pass filter which passes through a series resonance between the highest frequency in the half octave band and twice the lowest frequency in the same band.

4. A high frequency amplifier as in claim 3 and wherein said low pass filter comprises a plurality of stages, each stage respectively associated with a particular band of frequencies, and wherein each stage comprises a series inductance and a parallel capacitance.

5. A high frequency amplifier as in claim 1 wherein said hybrid network comprises a further transformer, said output transformer and further transformer being coupled to each other, said further transformer being center-tapped to form said port, said resistor being coupled to said center tap, the value of said resistor being approximately ¼ of the normal collector to collector load impedance.

6. A high frequency amplifier as in claim 5 and further comprising an inductance means connected in parallel with said resistor to form a direct current path by which power is supplied to said transistor.

7. A high frequency amplifier as in claim 6 and wherein said inductance means is of a value to present an impedance greater than said resistor at frequencies an order of magnitude less than the normal range of operation of the amplifier.

8. A high frequency amplifier as in claim 7 and further comprising a supply capacitor means coupled in parallel across the direct current path.

9. A high frequency amplifier as in claim 8 and wherein said supply capacitor means is of a value such that said resistor appears as a low reactance termination over a frequency range of approximately one order of magnitude less than the normal range of operation of the amplifier.

* * * * *